United States Patent [19]
Robles et al.

[11] Patent Number: 5,707,451
[45] Date of Patent: Jan. 13, 1998

[54] METHOD AND APPARATUS FOR CLEANING A THROTTLE VALVE

[75] Inventors: Stuardo A. Robles, Sunnyvale; Thanh Pham, San Jose; Bang C. Nguyen, Fremont, all of Calif.

[73] Assignee: Applied Materials, Inc., Santa Clara, Calif.

[21] Appl. No.: 450,833

[22] Filed: May 25, 1995

Related U.S. Application Data

[62] Division of Ser. No. 191,384, Feb. 3, 1994.
[51] Int. Cl.$^6$ .................................................. C23C 16/00
[52] U.S. Cl. ................... 118/715; 118/50; 118/50.1; 204/298.07; 204/298.33
[58] Field of Search .................. 118/715, 50, 50.1; 204/298.07, 298.33

[56] References Cited

U.S. PATENT DOCUMENTS

| | | | |
|---|---|---|---|
| 4,960,488 | 10/1990 | Law et al. | 156/643 |
| 4,975,252 | 12/1990 | Nishizawa | 422/245 |
| 4,989,544 | 2/1991 | Yoshikawa | 118/723 |
| 5,005,519 | 4/1991 | Egermeier | 118/722 |
| 5,067,437 | 11/1991 | Watanabe | 118/715 |
| 5,127,365 | 7/1992 | Koyama | 118/724 |
| 5,158,644 | 10/1992 | Cheung et al. | 156/643 |
| 5,250,092 | 10/1993 | Nakano | 96/136 |
| 5,260,236 | 11/1993 | Petro et al. | 437/241 |
| 5,328,515 | 7/1994 | Chouan | 118/723 ME |
| 5,346,555 | 9/1994 | Nunotani | 118/724 |
| 5,348,774 | 9/1994 | Golecki et al. | 427/543 |
| 5,356,657 | 10/1994 | Terada | 427/66 |
| 5,390,626 | 2/1995 | Nagasawa | 117/84 |
| 5,391,232 | 2/1995 | Kanai | 118/715 |
| 5,447,568 | 9/1995 | Hayakawa | 118/715 |

FOREIGN PATENT DOCUMENTS

| | | | |
|---|---|---|---|
| 0296891 | 6/1988 | European Pat. Off. | |
| 0435477 | 11/1990 | European Pat. Off. | |
| 63-53260 | 3/1988 | Japan | 204/298.07 |
| 2-276243 | 11/1990 | Japan | 204/298.33 |

OTHER PUBLICATIONS

Grove, Philip, Webster's Third New International Dictionary of the English Language Unabridged, G. & C. Merriam Company, 1229, 26, 1965.

Soukhanov, Webster's II New Riverside University Dictionary, p. 660, 1984.

"Throttle Valve for Vacuum System", May, 1968, IBM Technical Disclosure Bulletin, vol. 10, No. 12, 1988.

Primary Examiner—R. Bruce Breneman
Assistant Examiner—Jeffrie R. Lund
Attorney, Agent, or Firm—Barnes,Kisselle, Raisch,Choate, Whittemore &Hulbert P.C.

[57] ABSTRACT

An improved method of in-situ cleaning a throttle valve in a CVD device and exhaust flow control apparatus for facilitating such cleaning. The throttle valve is repositioned such that it is juxtaposed in close proximity to the exhaust gas port of the reaction chamber. A plasma is then ignited in a cleaning gas mixture of nitrogen trifluoride, hexafluoroethane and oxygen.

5 Claims, 2 Drawing Sheets

METHOD AND APPARATUS FOR CLEANING A THROTTLE VALVE

This application is a Divisional Application of prior U.S. application Ser. No. 08/191,384, filed Feb. 3, 1994.

FIELD OF THE INVENTION

The present invention generally relates to an improved method of cleaning a throttle valve attached to a vacuum deposition chamber and more particularly, relates to an improved method of in-situ cleaning a throttle valve attached in close proximity to a vacuum deposition chamber during the same cleaning cycle for the chamber interior. The present invention is further directed to an exhaust flow control apparatus which includes a throttle valve which is mounted immediately adjacent to the exhaust gas port of the vacuum deposition chamber.

BACKGROUND OF THE INVENTION

Chemical vapor deposition (hereinafter CVD) methods are used broadly in the manufacture of semiconductor wafers. CVD involves exposing a semiconductor wafer to a reactive gas under carefully controlled conditions of elevated temperatures, sub-ambient pressures, and uniform reactant gas flow rate so that a thin, uniform layer of film is deposited on the surface of the substrate. There are several types of CVD processes, such as, for example, atmospheric CVD, low-pressure CVD, reduced-pressure CVD and plasma enhanced CVD.

A commonly used CVD system is a single-wafer CVD system utilizing a high-throughput CVD chamber. This is a result of the more stringent standards of film quality and increasing wafer sizes utilized in recent years.

For processing, typically, a CVD chamber is first heated to about 300° C. to abut 1,000° C. A semiconductor substrate is mounted on a holding piece, called a susceptor, which is typically made of anodized aluminum. Then, processing gases are flowed into the chamber while the chamber pressure is regulated to an optimum level for achieving a uniform layer of film. The gases react to form a deposition layer on the surface of the wafer.

Since chamber pressure is an important processing parameter, means must be provided to accurately control such chamber pressure. The chamber pressure is controlled by regulating the flow rates of the gases and by an inlet flow regulating device, and by an exhaust flow control apparatus attached to the exhaust gas port of the vacuum deposition chamber. The exhaust flow control apparatus consists of a shut-off valve, a throttle valve and a vacuum pump with the shut-off valve typically connected directly to the exhaust gas port of the reaction chamber. During a standard deposition process, the shut-off valve remains open while the throttle valve opens and closes repeatedly to regulate the gas pressure in the chamber. The throttle valve is controlled by a servo-motor which is in turn controlled by a close-loop control system based on the feed-back signals from a pressure manometer mounted in the reaction chamber.

In a conventional deposition process, reactant gases enter the reaction chamber and produce films of various materials on the surface of a substrate for various purposes such as for dielectric layers, for insulation layers, etc. The various electronic materials deposited include epitaxial silicon, polysilicon, silicon nitride, silicon oxide, refractory metals such as titanium, tungsten and their silicides. In these film deposition processes, most of the material from the reactant gases is deposited on the substrate surface. However, it is inevitable that material is also deposited on other surfaces inside the chamber and on the throttle valve. This is especially true, in depositions of certain materials such as silicon oxide which requires a relatively high chamber pressure. It has been observed that the higher the deposition pressure required for a certain material, the more unwanted film is deposited inside She throttle valve.

In order to ensure the reproducibility of high quality wafer production, the reactant gas pressure inside the reaction chamber must be precisely controlled. This in turn requires the precise operation of the throttle valve in the exhaust flow control system. In a prior art CVD system, the exhaust flow control system consists of a shut-off valve installed immediately adjacent to the reaction chamber exhaust gas port, a throttle valve installed downstream from the shut-off valve at a distance of approximately 6–10 inches away from the reaction chamber exhaust port, and a vacuum pump installed downstream from and in fluid communication with the throttle valve and the shut-off valve. In this arrangement, semiconductor materials that are deposited at high chamber pressures, i.e., higher than 400 Torr, tend to deposit on the throttle valve after a certain number of deposition cycles.

In the normal operation of a CVD system, after each vacuum deposition process of coating a semiconductor substrate, a cleaning gas or a mixture of cleaning gases is purged through the reaction chamber in order to clean the chamber interior which includes the chamber walls and the susceptor. One such cleaning gas system is a mixture of nitrogen trifluoride, hexafluoroethane and oxygen for cleaning unwanted silicon oxide films from the chamber interior. Even though a plasma gas is ignited in the chamber to enhance its cleaning efficiency, the reactive species of the cleaning gas cannot reach the throttle valve for effective cleaning due to their limited lifetime. As a consequence, after several deposition processes are conducted in the reaction chamber, i.e., between 500 to 1,000 cycles, a sufficient amount of unwanted silicon oxide film is deposited and remains on the throttle valve to render it unfunctional, that is, the deposited material increases the diameter of the valve causing the throttle valve to scrape against the valve chamber as the throttle opens and closes. The scraping action prevents a smooth motion of the throttle valve; instead, the throttle valve functions sluggishly and is no longer capable of providing accurate pressure control in the reaction chamber. This basically inoperable throttle valve leads to poor pressure control in the reaction chamber and thereby contributes to the production of silicon wafers having poor repeatability and reliability.

Periodically, after approximately 500 to 1,000 deposition cycles, therefore, the throttle valve assembly must be completely disassembled and manually cleaned by a wet chemistry technique. This is a very laborious and time consuming process which leads to poor throughput and increased cost of manufacturing. Furthermore, after each manual cleaning process, the entire exhaust flow control system must be recalibrated in order to resume the production of silicon wafers in the reaction chamber.

It is therefore an object of the present invention to provide an in-situ cleaning method for the throttle valve used in a vacuum deposition device that does not have the shortcomings of the prior art methods.

It is another object of the present invention to provide an improved in-situ cleaning method of a throttle valve without extensive equipment modifications.

It is a further object of the present invention to provide an improved in-situ cleaning method for a throttle valve used in a vacuum deposition device which can be effectively carried out in the regular chamber cleaning process after each deposition cycle.

It is yet another object of the present invention to provide an exhaust flow control system that includes a throttle valve for regulating the gas pressure in the vacuum deposition chamber which can be cleaned in-situ with the chamber interior during a regular chamber cleaning cycle.

SUMMARY OF THE INVENTION

In accordance with the present invention, an improved method of in-situ cleaning a throttle valve used in a vacuum deposition system during a regular chamber cleaning cycle and an improved exhaust flow control apparatus for such a vacuum deposition chamber are provided.

In the preferred embodiment, the improved method of in-situ cleaning a throttle valve is provided by first repositioning the throttle valve such that it is juxtaposed in close proximity to the exhaust gas port of the reaction chamber and positioning a shut-off valve down stream from the throttle valve. A cleaning gas mixture of nitrogen trifluoride, hexafluoroethane and oxygen is used after each deposition process to clean the chamber interior and the throttle valve. A plasma is ignited in the cleaning gas mixture to further enhance its cleaning effectiveness. Other cleaning gases such as chlorine trifluoride, sulfur hexafluoride, carbon tetrafluoride, and mixtures thereof may also be used in this in-situ cleaning method.

The present invention is further directed to an exhaust flow control apparatus used in a vacuum deposition chamber for controlling the flow passage and regulating gas pressure in the vacuum deposition chamber. The exhaust flow control apparatus consists of a throttle valve mounted immediately adjacent to the exhaust gas port of the vacuum chamber, a shut-off valve mounted downstream from and in fluid communication with the throttle valve for opening or closing of the flow passage, and a pump mounted downstream from the shut-off valve for evacuating gas from the vacuum deposition chamber.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENTS

The present invention provides an improved method of in-situ cleaning a throttle valve attached to a vacuum deposition chamber during the regular cleaning cycle for the chamber interior after each film deposition process and an exhaust flow control apparatus containing such a throttle valve adapted for in-situ cleaning during such a regular cleaning cycle.

Figure 1A:
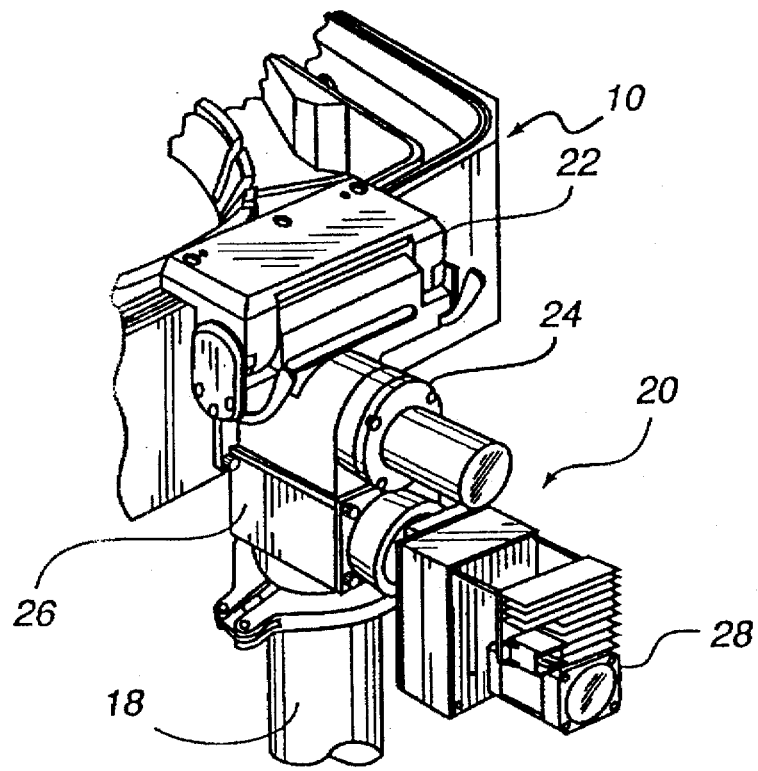
FIG. 1A is a partial perspective view of a prior art exhaust flow control apparatus.

Referring initially to FIG. 1A, a partial perspective view of an exhaust flow control apparatus attached to a vacuum deposition chamber in a prior art arrangement is shown. A CVD vacuum deposition chamber 10 for processing semiconductor substrates has an exhaust flow control apparatus 20 attached to the side of the chamber through a flow adapter 22. Connected to the flow adapter 22 is a shut-off valve 24 for the opening and closing of the flow passage therein. Throttle valve 26 is connected to and in fluid communication with the shut-off valve 24. The throttle valve 26 is controlled by a precision servo-motor 28 which is in turn controlled by close-loop feedback signals received from the pressure manometer (not shown) attached to the vacuum deposition chamber 10. The gas exhausted from the vacuum deposition chamber 10 passes through the flow adapter 22, the shut-off valve 24, and the throttle valve 26 into flow passage pipe 18 to a pump (not shown).

In this prior art arrangement of the exhaust flow control apparatus 20, the shut-off valve 24 is positioned immediately adjacent to the flow adapter 22 and the throttle valve 26 is mounted further downstream from the shut-off valve. As a consequence, the throttle valve 26 is positioned at a distance approximately between 6 to 10 inches away from vacuum deposition chamber 10. After each deposition cycle when a plasma cleaning cycle is carried out with a mixture of cleaning gases, but the mixture of the cleaning gases cannot reach the throttle valve while in plasma. This in-situ cleaning method for the chamber walls therefore is not effective in cleaning the throttle valve. After a certain number of deposition cycles, i.e., between approximately 500 to 1,000, the throttle valve 26 must be completely disassembled and cleaned manually. This laborious task not only is time consuming but also requires recalibration of the deposition system after such a cleaning process.

Figure 1B:
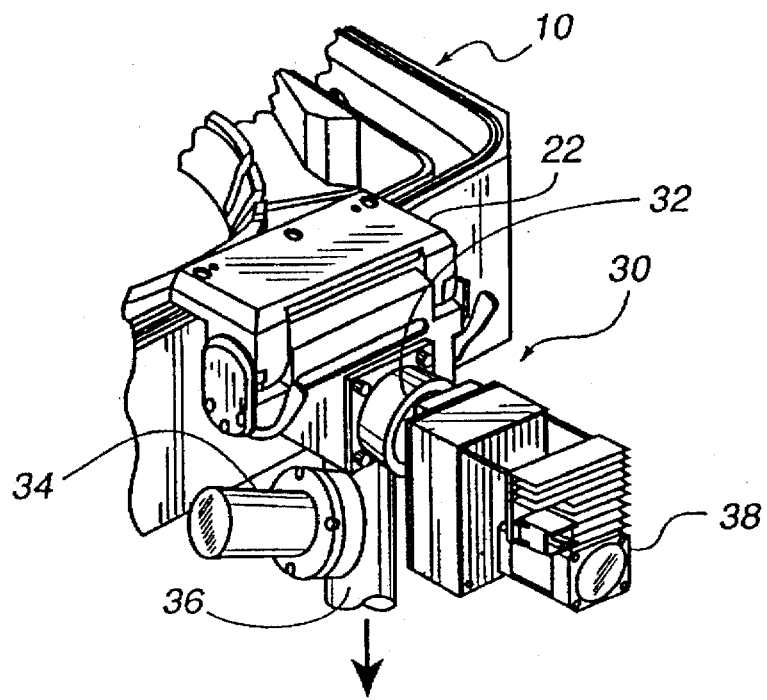
FIG. 1B is a partial perspective view of an exhaust flow control apparatus of the present invention.

FIG. 1B shows a partial perspective view of the present invention wherein an improved exhaust flow control apparatus 30 is attached to a vacuum deposition chamber 10. It is seen that in this exhaust flow control apparatus 30, a throttle valve 32 is attached directly to the flow adapter 22 in close proximity with the exhaust gas port of the vacuum deposition chamber 10. A shut-off valve 34 is attached downstream from the throttle valve 32 on the flow passage 36. The throttle valve 32 is controlled by a precision servo-motor 38 similar to that shown in FIG. 1A. It should be noted that in this improved configuration, the position of the throttle valve 32 is no more than between 1–3 inches away from the vacuum deposition chamber 10. At such a close proximity to the vacuum deposition chamber 10, the regular in-situ chamber cleaning cycle carried out after each deposition process can effectively clean throttle valve 32 each time the interior chamber walls are cleaned. This eliminates the task of wet chemical cleaning after approximately between 500 to 1,000 cycles that necessitates a complete disassembly of the exhaust flow control apparatus 30.

Figure 2:
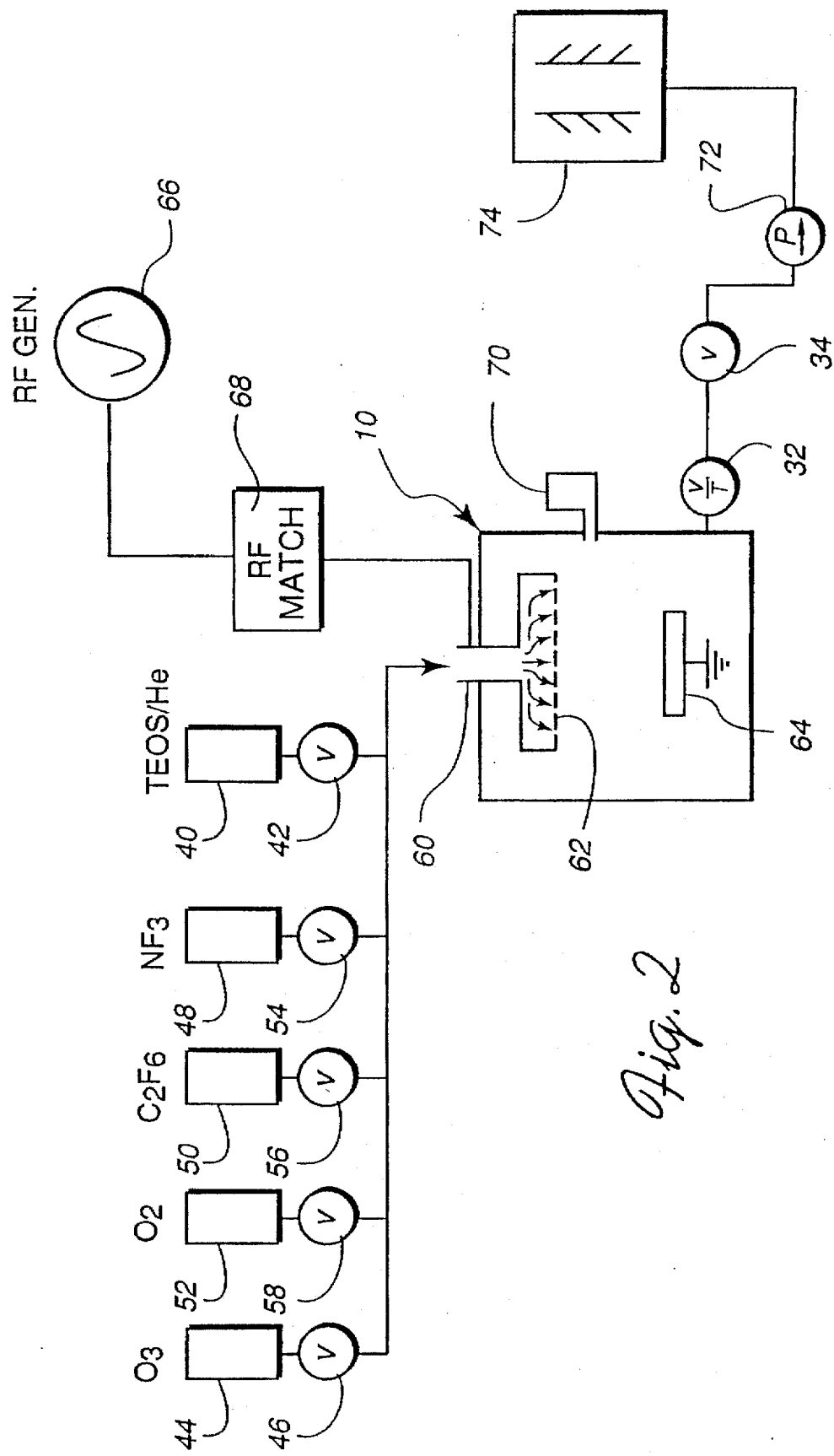
FIG. 2 is a process flow diagram for a typical vacuum deposition chamber and an exhaust flow control apparatus of the present invention.

FIG. 2 shows a process flow diagram for a vacuum deposition process in which a CVD chamber 10 is used. Although there are a number of different types of thin films that can be deposited using CVD, the diagram is shown for silicon oxide films on semiconductor substrates. The first reactant gas of tetra-ethoxy-ortho-silicate with its carrier helium in a mixture 40 is fed into the system through a flow control valve 42. Other gases such as silane ($SiH_4$) and oxygen ($O_2$) may also be used. Another reactant gas, ozone 44, is also fed into the system through flow control valve 46. For plasma cleaning, supplies of nitrogen trifluoride 48, hexafluoroethane 50 and oxygen 52 are fed into the system through flow control valves 54, 56, and 58, respectively.

The reactant gases are fed into reaction chamber 10 through a gas inlet 60 which includes a gas distribution plate 62 for the distribution of the gases., Gas inlet 60 also acts as the upper electrode and is sometimes called a showerhead or a gas distribution plate. The lower electrode or the susceptor 64 is normally grounded when RF power is required. A RF generator 66 provides RF power through a matching network 68 to the upper electrode 60. A pressure manometer 70 monitors the gas pressure, which is maintained usually at greater than 200 Torr during the deposition process. The temperature of the chamber is elevated to usually greater than 100C. At the elevated temperature, and if desired, with RF applied, the gases will react and deposit a layer on the surface of the wafer. During the deposition process, the reactant gases deposit on all of the interior surfaces of the chamber as well as the throttle valve, which is in a substantially closed position during the deposition process. When the deposition process is finished, the wafer is removed from the chamber and a plasma cleaning process is run to clean the deposits from the walls of the chamber, and in this invention, the throttle valve as well.

For the plasma chamber clean, the cleaning gases are flowed into the chamber such that the chamber pressure can be maintained at usually less than 200 Torr, or a pressure by which the throttle valve will be in a substantially closed position, so that surface of the throttle valve that needs cleaning will be exposed to the interior of the chamber. The temperature inside the vacuum chamber 10 during such cleaning process is in the range between 100° to 500° C. A plasma is ignited in the cleaning gas by applying RF power, thereby causing the gas to react with the deposit layers and etch the layers away. The time required for the cleaning process depends on the thickness of the deposit and is preferably less than or equal to 4 minutes.

The exhaust flow control apparatus 30 shown in FIG. 1B is shown here as throttle valve 32 and shut-off valve 34 connected and in fluid communication with pump 72 such that the exhaust gas mixture from vacuum deposition chamber 10 is fed into a scrubber 74 for treatment. Throttle valve 32 is placed in close proximity to the chamber so that the plasma cleaning gas will reach the throttle valve and clean deposited material from the throttle valve surface.

The improved in-situ cleaning method of the present invention provides a unique arrangement of the throttle valve close to the vacuum deposition chamber such that the valve can be cleaned during the regular chamber cleaning cycle after each deposition process. This enables the throttle valve to be cleaned by plasma as well as the chamber walls, each time after the deposition cycle to get rid of silicon oxide or other film material deposits. This effective cleaning procedure prevents the throttle valve from malfunctioning, which in turn provides for more consistent processing from wafer to wafer, and further allows for regular cleaning of the throttle valve so that a manual wet clean is not needed.

It should be noted that even though the deposition of silicon oxide films is used as an example in the preferred embodiment, the present improved in-situ cleaning method for the throttle valve can be used in the deposition process of any film materials when the cleaning of such throttle valve is desired.

It should also be noted that even though the cleaning gas mixture of nitrogen trifluoride, hexafluoroethane and oxygen is illustrated in the preferred embodiment, any other cleaning gas which will react with and etch away deposited material from the deposition process may also be suitably used to provide the same desirable results.

While the present invention has been described in an illustrative manner, it should be understood that the terminology used is intended to in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. An exhaust flow control apparatus attached to a vacuum chamber for controlling a flow passage and regulating gas pressure in said chamber wherein said apparatus has the tendency of accumulating unwanted film deposits after repeated deposition processes being conducted in said chamber, comprising:

a throttle valve mounted adjacent to said vacuum chamber for regulating the gas pressure in said chamber;

a shut-off valve mounted downstream from and in fluid communication with said throttle valve for opening or closing said flow passage; and a pump mounted downstream from said shut-off valve for evacuating gas from said vacuum chamber.

2. A chemical vapor deposition device for depositing films on substrates comprising:

a vacuum chamber for conducting said film deposition process;

a throttle valve mounted not more than between 1~3 inches away from said vacuum chamber for regulating gas pressure in said chamber; and a gas evacuating device downstream from and in fluid communication with said throttle valve.

3. A device according to claim 2, wherein said device further includes a shut-off valve mounted downstream from and in fluid communication with said throttle valve.

4. An exhaust flow control apparatus attached to a vacuum chamber for controlling a flow passage and regulating gas pressure in said chamber wherein said apparatus has the tendency of accumulating unwanted film deposits after repeated deposition processes being conducted in said chamber, comprising:

a throttle valve mounted not more than between 1~3 inches away from said vacuum chamber for regulating the gas pressure in said chamber; and a pump mounted downstream from said shut-off valve for evacuating gas from said vacuum chamber.

5. A device according to claim 4, wherein said device further includes a shut-off valve mounted downstream from and in fluid communication with said throttle valve.

* * * * *